United States Patent
Li et al.

(10) Patent No.: US 8,026,872 B2
(45) Date of Patent: Sep. 27, 2011

(54) ELECTROLUMINESCENT DISPLAY

(75) Inventors: Shi-Hao Li, Hsin-Chu (TW); Ching-Ian Chao, Hsin-Chu (TW); Jiun-Haw Lee, Hsin-Chu (TW); Mao-Kuo Wei, Hsin-Chu (TW); Hoang-Yan Lin, Hsin-Chu (TW); Kuan-Yu Chen, Hsin-Chu (TW); Yu-Hsuan Ho, Hsin-Chu (TW); Sheng-Chih Hsu, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 722 days.

(21) Appl. No.: 11/750,317

(22) Filed: May 17, 2007

(65) Prior Publication Data

US 2008/0100540 A1    May 1, 2008

(30) Foreign Application Priority Data

Oct. 30, 2006    (TW) ................................ 95140083 A

(51) Int. Cl.
G09G 3/30    (2006.01)
(52) U.S. Cl. ......................................................... 345/76
(58) Field of Classification Search ................ 345/76–77
See application file for complete search history.

(56) References Cited

U.S. PATENT DOCUMENTS

| | | |
|---|---|---|
| 6,277,471 B1 | 8/2001 | Tang |
| 6,833,667 B2 | 12/2004 | Hamano |
| 6,907,109 B2 | 6/2005 | Polichar |
| 6,911,674 B2 | 6/2005 | Evans |
| 7,144,752 B2 | 12/2006 | Yotsuya |
| 2002/0084952 A1* | 7/2002 | Morley et al. .................... 345/32 |
| 2004/0169919 A1* | 9/2004 | Uehara et al. ................. 359/443 |
| 2004/0189185 A1* | 9/2004 | Yotsuya ........................ 313/501 |
| 2005/0002204 A1 | 1/2005 | Lin |
| 2005/0041410 A1* | 2/2005 | Yamashita et al. .............. 362/31 |
| 2005/0185115 A1 | 8/2005 | Yee |

FOREIGN PATENT DOCUMENTS

| | | |
|---|---|---|
| CN | 1661439 A | 8/2005 |
| CN | 1673846 A | 9/2005 |
| JP | 09-171892 | 6/1997 |
| JP | 2003-059641 | 2/2003 |
| JP | 2004-127661 | 4/2004 |
| TW | 585837 | 5/2004 |
| TW | 200511893 | 3/2005 |
| TW | I234415 | 6/2005 |
| TW | M276687 | 10/2005 |
| WO | 96/23649 | 8/1996 |

* cited by examiner

Primary Examiner — Amr Awad
Assistant Examiner — Waseem Moorad
(74) Attorney, Agent, or Firm — Winston Hu; Scott Margo

(57) ABSTRACT

An electroluminescent display includes an electroluminescent panel, and at least one brightness enhanced film. The electroluminescent panel has a plurality of sub-pixels, and at least one illumination surface. The brightness enhanced film is disposed on the at least one illumination surface. The brightness enhanced film has a plurality of micro lenses, and the width of the micro lens is smaller than half of the minimum width of the sub-pixels.

13 Claims, 10 Drawing Sheets

ELECTROLUMINESCENT DISPLAY

BACKGROUND OF THE INVENTION

1. Field of the Invention

The invention relates to an electroluminescent display, and more particularly, to an electroluminescent display having a brightness enhanced film that can increase brightness gain and reduce image blur.

2. Description of the Prior Art

Flat displays have advantages, such as saving electricity, low radiation, small size, etc., over the traditional cathode ray tube (CRT) displays. For these reasons, flat displays are replacing CRT displays gradually. With the improvements of flat display techniques, the prices of flat displays are getting lower. Therefore, flat displays are more popular and undergoing developments for larger sizes. The electroluminescent display is a most remarkable product among the flat displays at present because of having an advantage of high contrast.

Please refer to FIG. 1. FIG. 1 is a schematic diagram of a conventional electroluminescent display. As shown in FIG. 1 the conventional electroluminescent display 10 includes a lower substrate 12, an upper substrate 14, a plurality of illumination components 16 disposed between the lower substrate 12 and the upper substrate 14, and an encapsulation layer 18 disposed between the lower substrate 12 and the upper substrate 14 so as to encapsulate the illumination components 16 between the lower substrate 12 and the upper substrate 14.

Each illumination component 16 includes an anode 20, a cathode 22 and an organic luminescence layer 24 disposed between the anode 20 and the cathode 22. While displaying images, a voltage difference exists between the anode 20 and the cathode 22 of the illumination component 16. Holes will enter the organic luminescence layer 24 having a characteristic of illumination via the anode 20, and electrons also will enter the organic luminescence layer 24 via the cathode 22. When holes and electrons recombine in the organic luminescence layer 24, excitons will be formed. At the same time, the excitons are in a high energy and unstable state. When the excitons return to the stable ground state, the energy of the excitons will be released. Depending on different illumination materials of the organic luminescence layer 24, the energy will be released in the types of the light of different colors so as to produce radiation of the illumination component 16.

While displaying images, the light produced by the illumination component 16 will be emitted to the lower substrate 12. Because the refractive index of the lower substrate 12 (usually being a material of glass) is different from the refractive index of the external environment, the light L will have phenomenon of refraction and reflection when passing through the downward surface of the lower substrate 12, that is, the interface of the lower substrate 12 and air. As shown in FIG. 1, when the light is emitted to the downward surface of the lower substrate 12, the light L having the incident angle smaller than the critical angle c will be refracted and be emitted out to be effective light Le. When the incident angle is larger than the critical angle c, the total reflection effect will happen. The light will be totally reflected by the downward surface of the lower substrate 12 to be ineffective light Li. In the light L emitted by the illumination component 16, the ineffective light Li cannot pass the lower substrate 12 so that the illumination efficiency of the conventional electroluminescent display 10 is lower. Therefore, it is necessary to increase the illumination efficiency further.

SUMMARY OF THE INVENTION

It is therefore an objective of the present invention to provide an electroluminescent display so as to increase the display brightness.

According to one embodiment of the invention, the electroluminescent display comprises an electroluminescent panel, and at least one brightness enhanced film. The electroluminescent panel comprises a plurality of sub-pixels, and at least one illumination surface. The brightness enhanced film is disposed on the illumination surface of the electroluminescent panel. The brightness enhanced film has a plurality of micro lenses, and, wherein each of the plurality of micro lenses has a width smaller than half of the minimum width of the plurality of sub-pixels.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
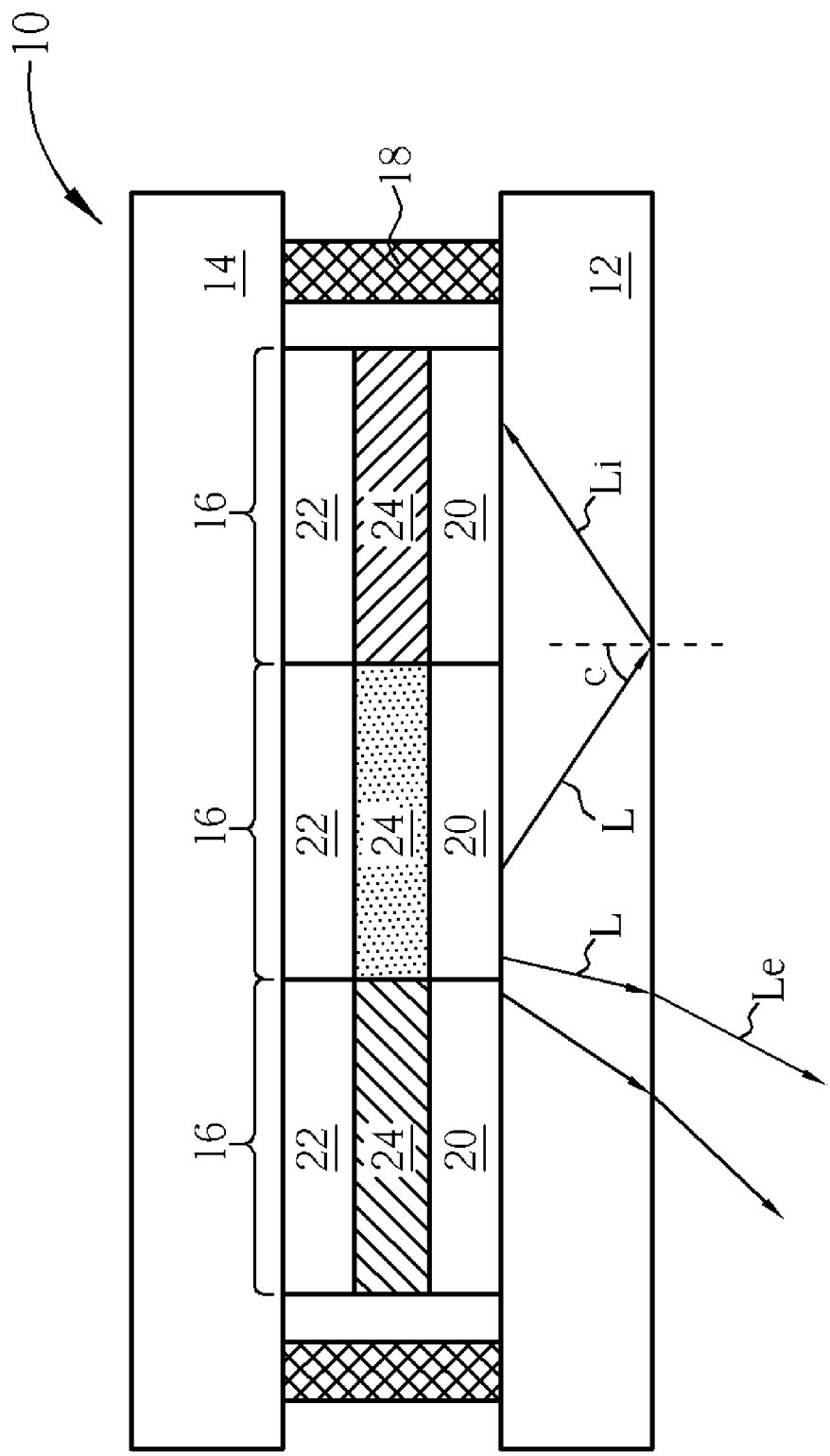
FIG. 1 is a schematic diagram of a conventional electroluminescent display.
Figure 2:
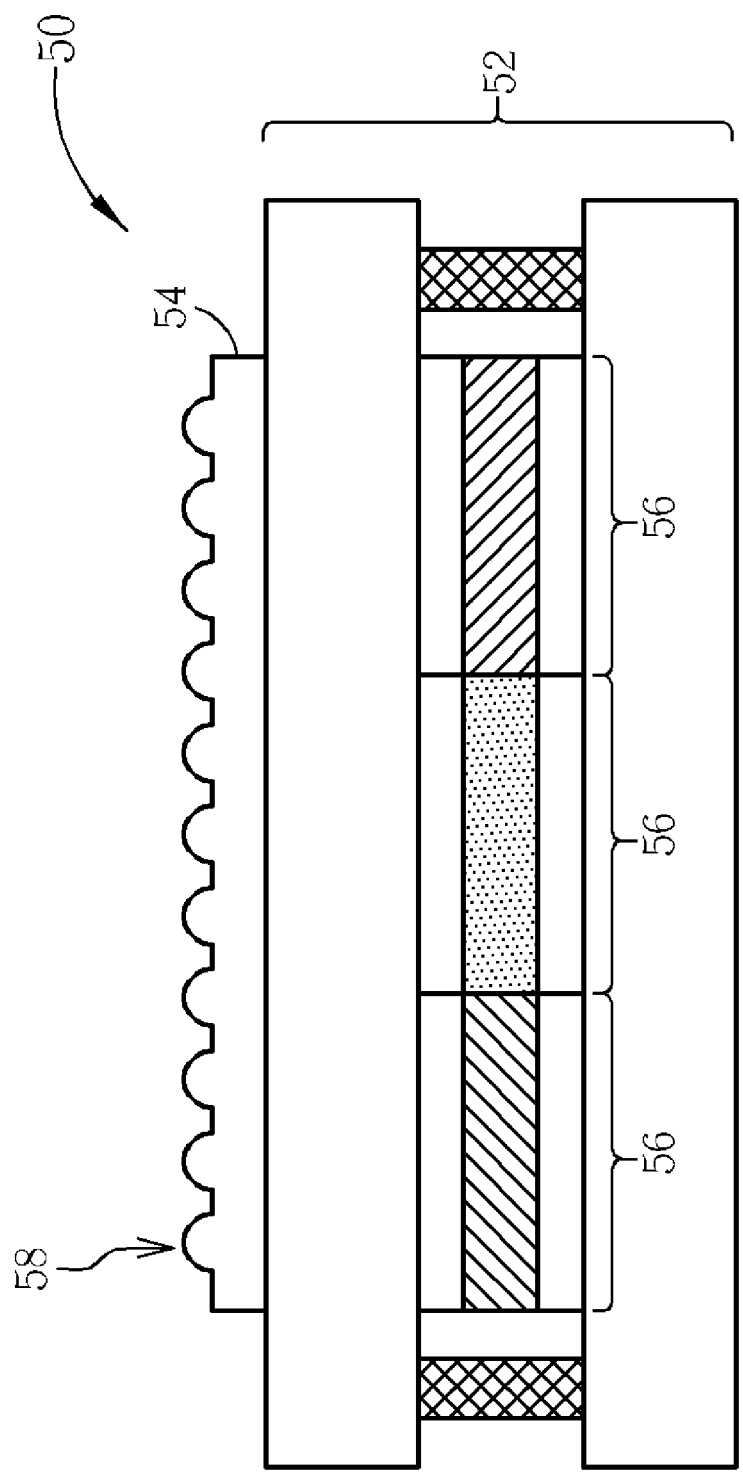
FIG. 2 is a cross-sectional schematic diagram of the electroluminescent display according to a preferred embodiment of the present invention.
Figure 3:
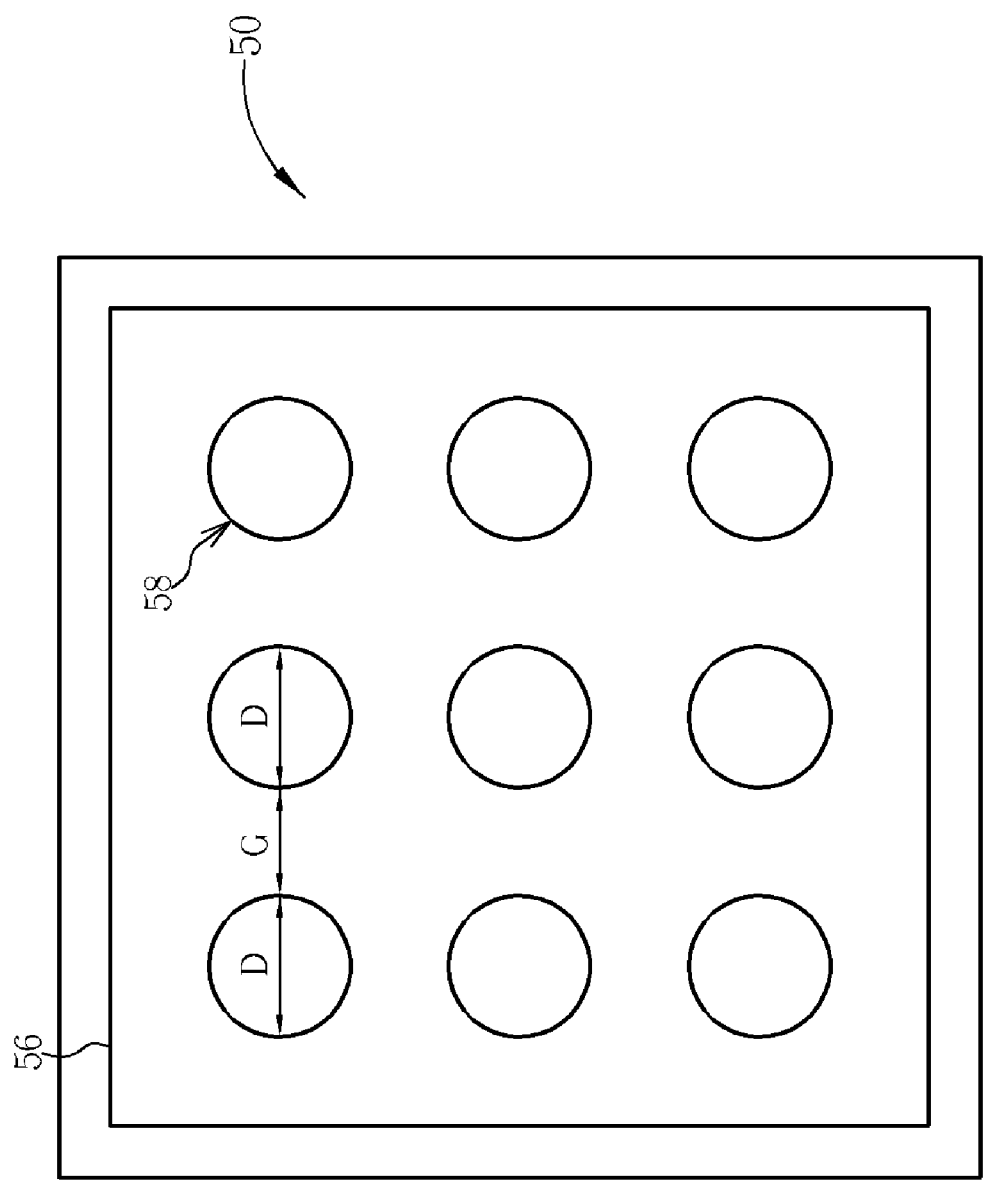
FIG. 3 is a top view of the electroluminescent display shown in FIG. 2.

Please refer to FIG. 2 and FIG. 3. FIG. 2 is a cross-sectional schematic diagram of the electroluminescent display according to a preferred embodiment of the present invention. FIG. 3 is a schematic top view of the electroluminescent display shown in FIG. 2. The electroluminescent display 50 of the embodiment includes an electroluminescent panel 52, and at least one brightness enhanced film 54 disposed on a surface of the electroluminescent panel 52. The electroluminescent panel 52 can be an organic light emitting diode panel, a polymer light emitting diode panel or another kind of electroluminescent panel.

The electroluminescent panel 52 includes a plurality of sub-pixels 56 such as red sub-pixel, green sub-pixel and blue sub-pixel. The embodiment takes a single-sided light-emitting type as an example to describe the present invention. Therefore, a surface of the electroluminescent panel 52 is an illumination surface, and the brightness enhanced film 54 is disposed on the illumination surface. But the electroluminescent display 50 also can be a double-sided light-emitting type. In this condition, two surfaces of the electroluminescent panel 52 are illumination surfaces, and the brightness enhanced films 54 can be disposed on the two surfaces respectively.

The brightness enhanced film 54 of the present invention comprises a plurality of micro lenses 58, and the width of each micro lens 58 is smaller than half of the minimum width of the sub-pixels 56. In this embodiment, each micro lens 58 is a hemisphere-like structure, so the width of each micro lens 58 is the diameter D of the hemisphere-like structure. In addition, the micro lenses 58 are arranged in a rectangular array, such as a square array. In this embodiment, each sub-pixel 56 is a rectangular area, so the minimum width of the sub-pixel 56 is the width of the rectangular area.

Figure 4:
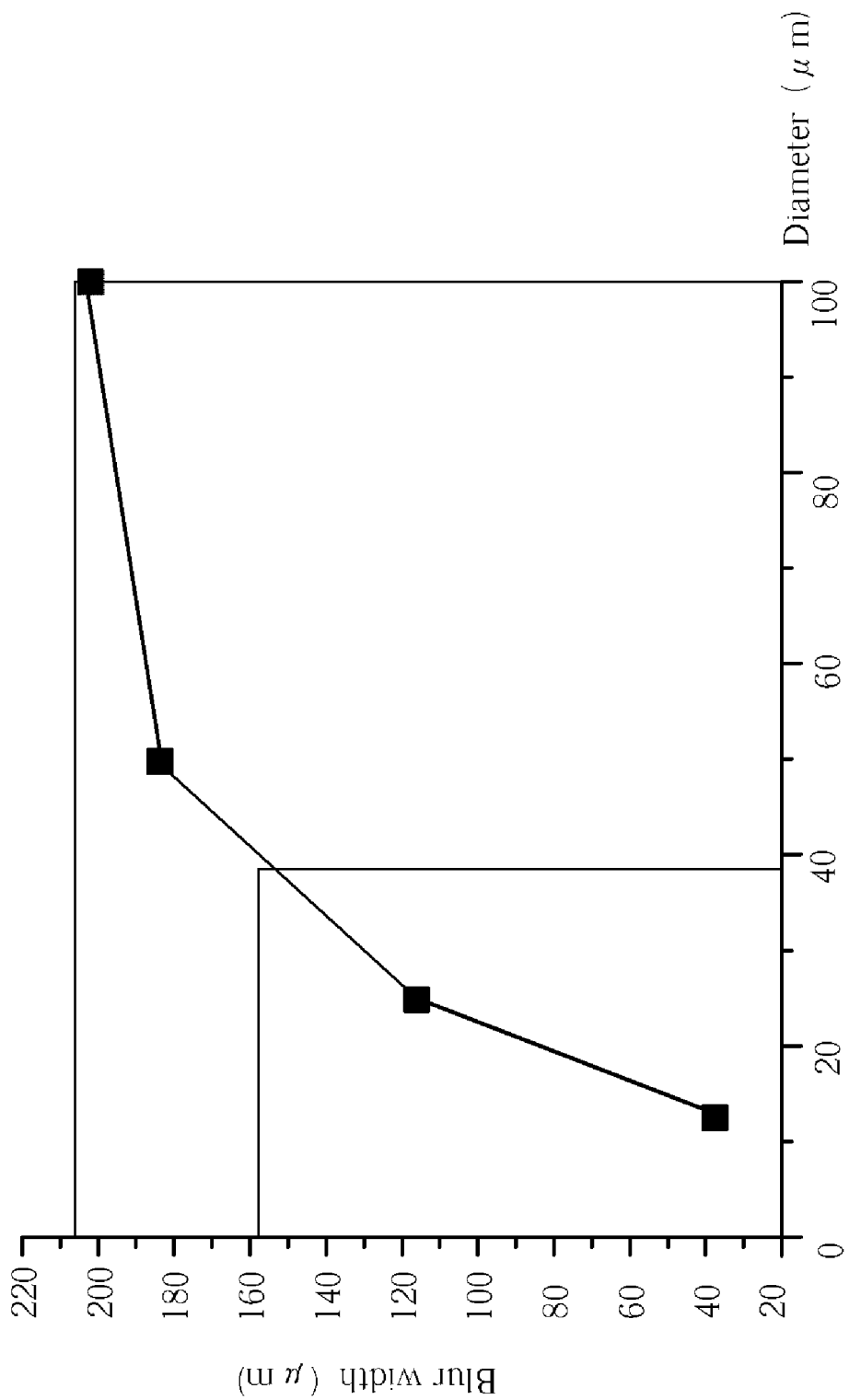
FIG. 4 shows a relationship diagram between the diameter of the hemisphere-like micro lens and the blur width while displaying.

Please refer to FIG. 4, and refer to FIG. 2 and FIG. 3 together. FIG. 4 shows a relationship diagram between the diameter of the hemisphere-like micro lens and the blur width while displaying, wherein the relationship between the diameter of the micro lens and the blur width is obtained by optical simulation. In this simulation, the width of the sub-pixel is 100 micrometer, and the diameter of the hemisphere-like structure is D (micrometer). In addition, the definition of the blur width 2w is twice of the distance W apart from the center of the sub-pixel, and w corresponds with the relation $l(w)=lo*(1/e)$, wherein lo is the brightness of the center of the sub-pixel, and l(w) is the brightness of the distance w apart from the center of the sub-pixel, wherein e is natural logarithm (approximately 2.71828). According to FIG. 4, the blur width and the diameter of the hemisphere-like structure have substantially an exponential proportional relationship. In the condition of the diameter of the hemisphere-like structure getting smaller, the blur width is also getting smaller. The smaller blur width represents the blur effect of the sub-pixel is more unobvious, wherein when the diameter of the hemisphere-like structure is substantially smaller than half of the width of the sub-pixel, the blur effect can be improved in displaying images.

Figure 5:
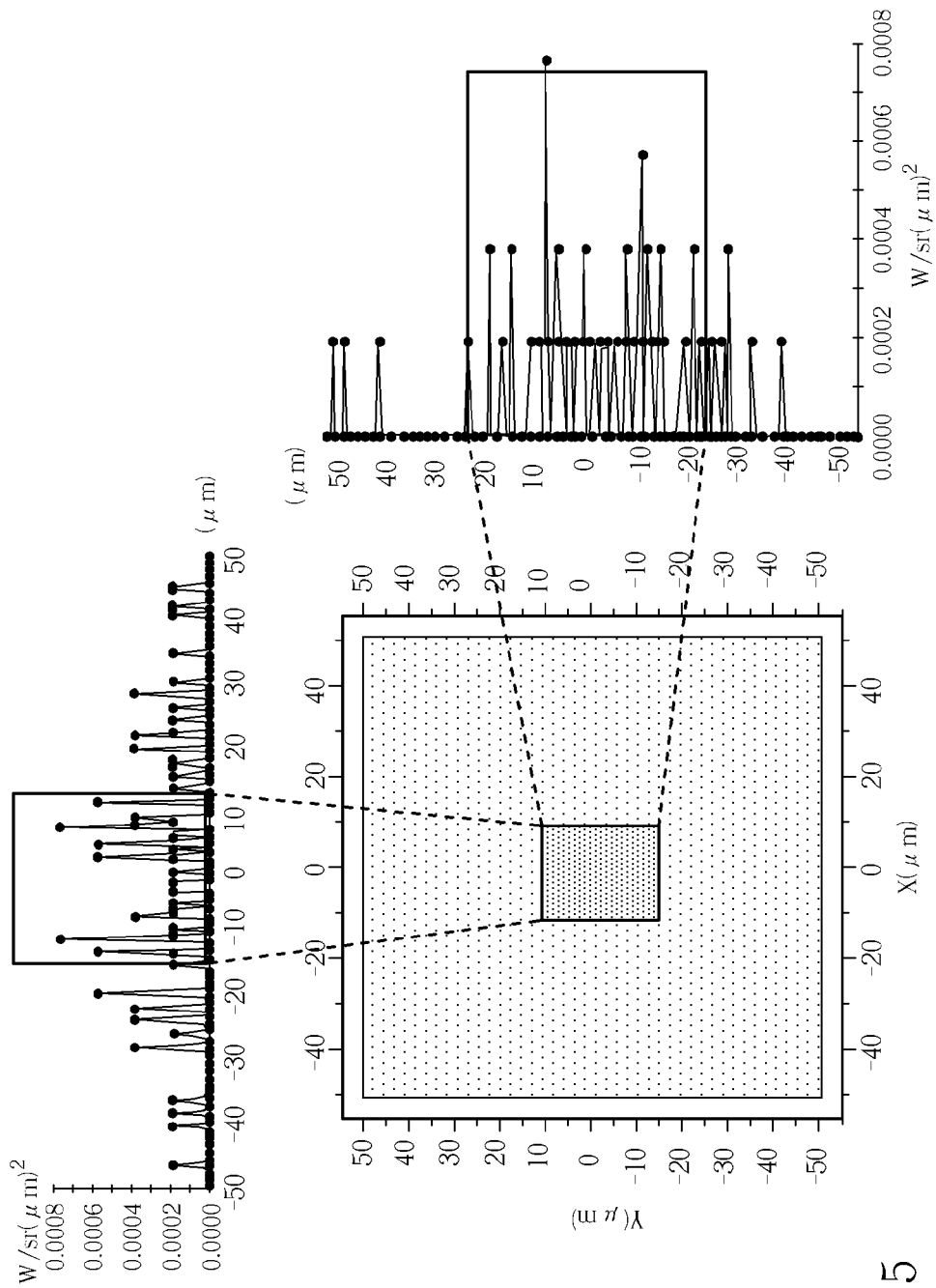
FIG. 5 is a brightness distribution schematic diagram of the sub-pixel according to the embodiment.

Please refer to FIG. 5. FIG. 5 is a schematic diagram of brightness distribution of the sub-pixel according to the above embodiment. In this embodiment, the sub-pixel is a rectangular area of 100 micron multiplied by 100 micron. The micro lenses are hemisphere-like structures arranged in a square array, and the diameter is 20 micron. The distance (as indicated by the G in FIG. 3) between two adjacent hemisphere-like structures is substantially 0.78 micron. As shown in FIG. 5, no matter the brightness distribution in the horizontal direction (X direction) or the brightness distribution in the vertical direction (Y direction), the sub-pixels all are affected by the micro lens of the hemisphere-like structures to have the condensing effect so as to produce the effect of the brightness gain. In addition, because the diameter of the micro lens of the hemisphere-like structure is smaller than half of the width of the sub-pixel, the blur phenomenon will reduce. Therefore, the adjacent sub-pixels will not disturb to each other in displaying images.

Figure 6:
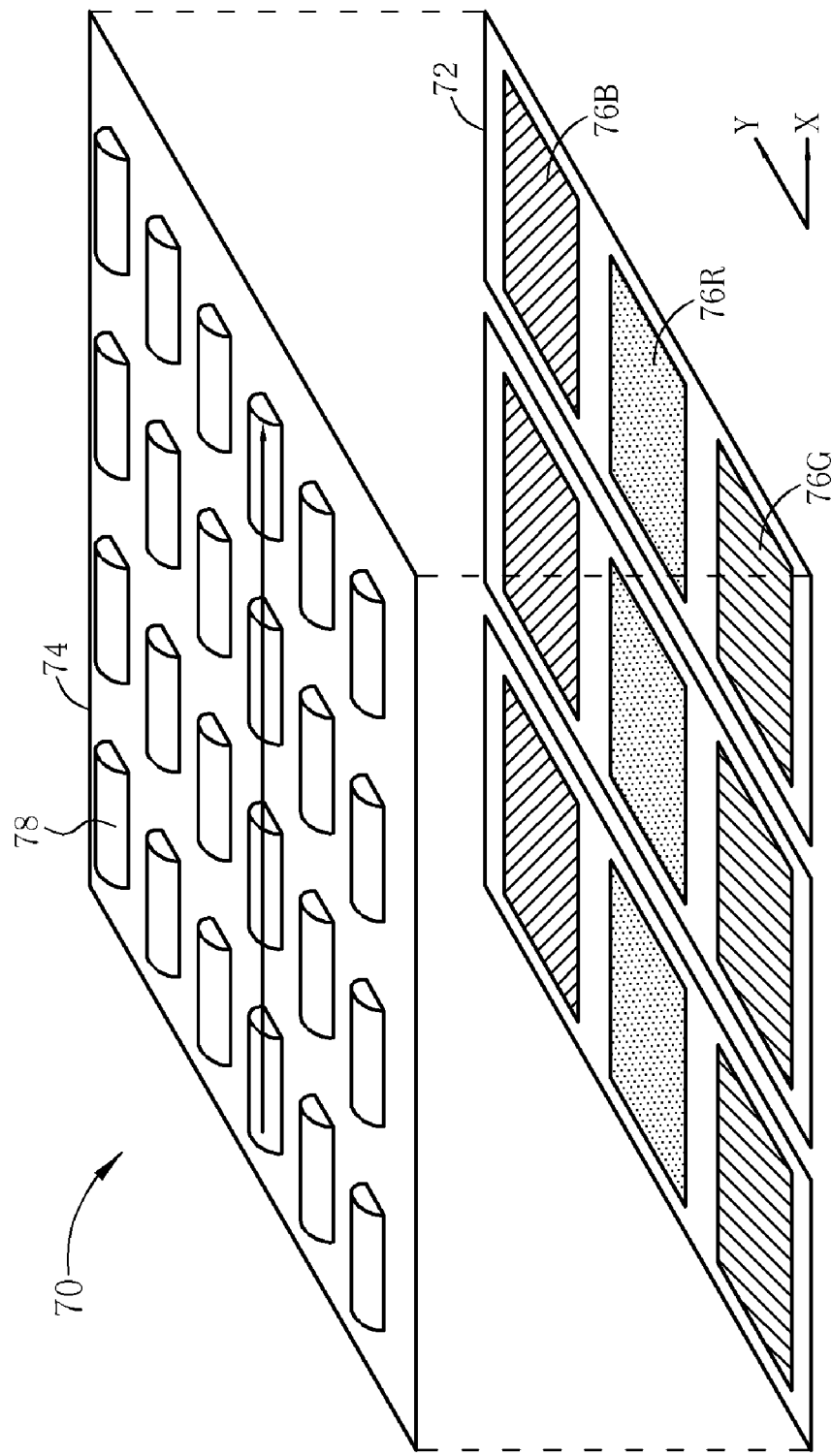
FIG. 6 is a schematic diagram of the electroluminescent display according to another preferred embodiment of the present invention.
Figure 7:
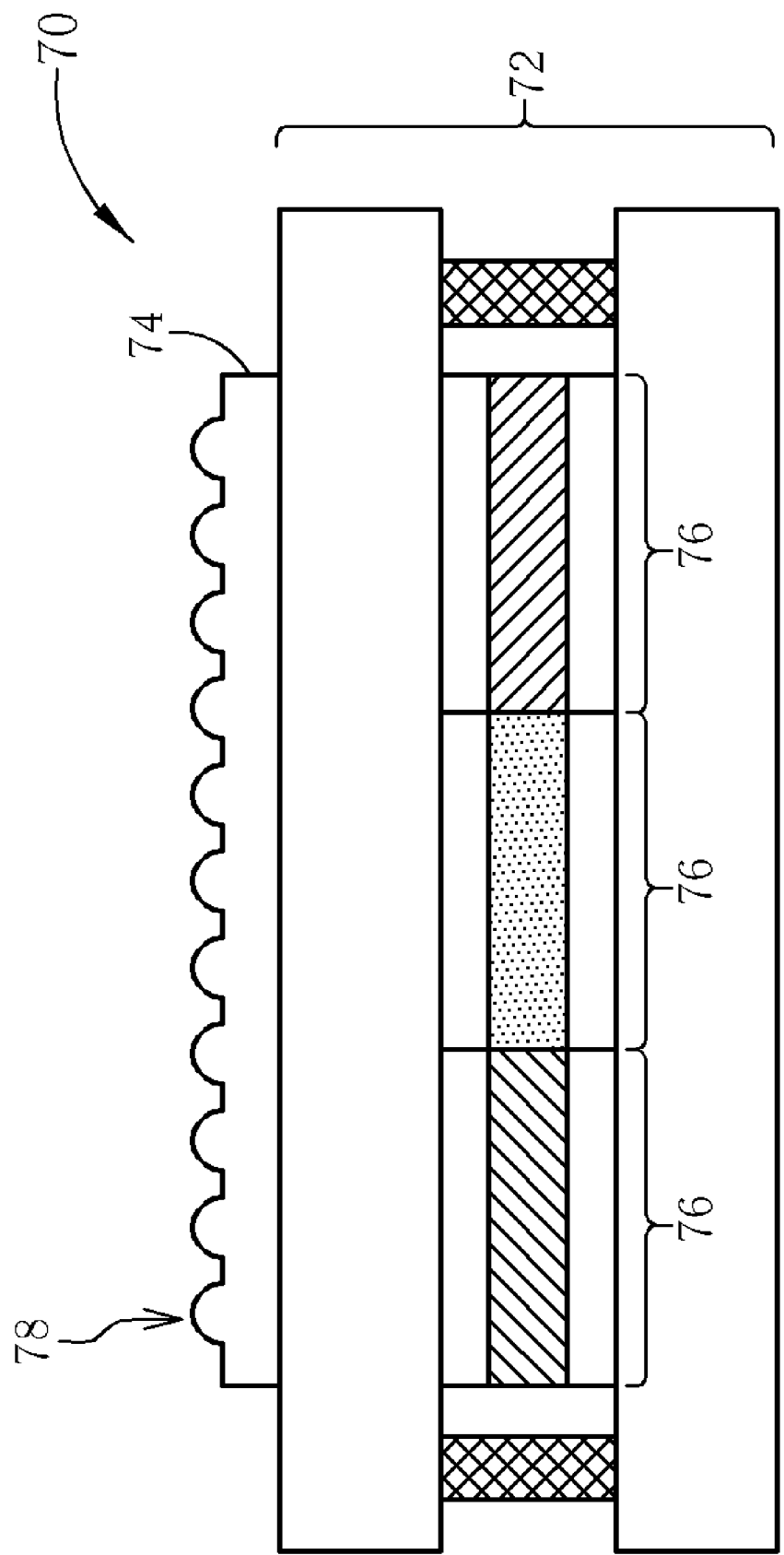
FIG. 7 is a cross-sectional schematic diagram of the electroluminescent display shown in FIG. 6.

Please refer to FIG. 6 and FIG. 7. FIG. 6 is a schematic diagram of the electroluminescent display according to another preferred embodiment of the present invention. FIG. 7 is a cross-sectional schematic diagram of the electroluminescent display shown in FIG. 6. As shown in FIG. 6 and FIG. 7, the electroluminescent display 70 of the embodiment includes an electroluminescent panel 72 and at least one brightness enhanced film 74 disposed on a surface of the electroluminescent panel 72. The electroluminescent panel 72 includes a plurality of sub-pixels 76. The sub-pixels include red sub-pixels, green sub-pixels and blue sub-pixels, and the sub-pixels of the same color are arranged in the same direction (X direction). In other words, the sub-pixels of different color are arranged in Y direction.

The brightness enhanced film 74 of the present invention includes a plurality of micro lenses 78, and the width of each micro lens 78 is smaller than half of the minimum width of the sub-pixels 76. The micro lenses 78 are arranged in a rectangular array such as a square array. In addition, each sub-pixel 76 is a rectangular area, so the minimum width of the sub-pixels 76 is the width of the rectangular area. The micro lens 78 in this embodiment is a semicylinder-like structure, so the width of the micro lens 78 is the diameter of the semicylinder-like structure. In this embodiment, the length of the semicylinder-like structure is smaller than the width of the sub-pixels, that is, the width of the rectangular area. Each semicylinder-like structure has a major axis direction (as indicated by the arrow in FIG. 6), and the major axis direction is parallel to the arranged direction (X direction) of the sub-pixel of the same color.

Figure 8:
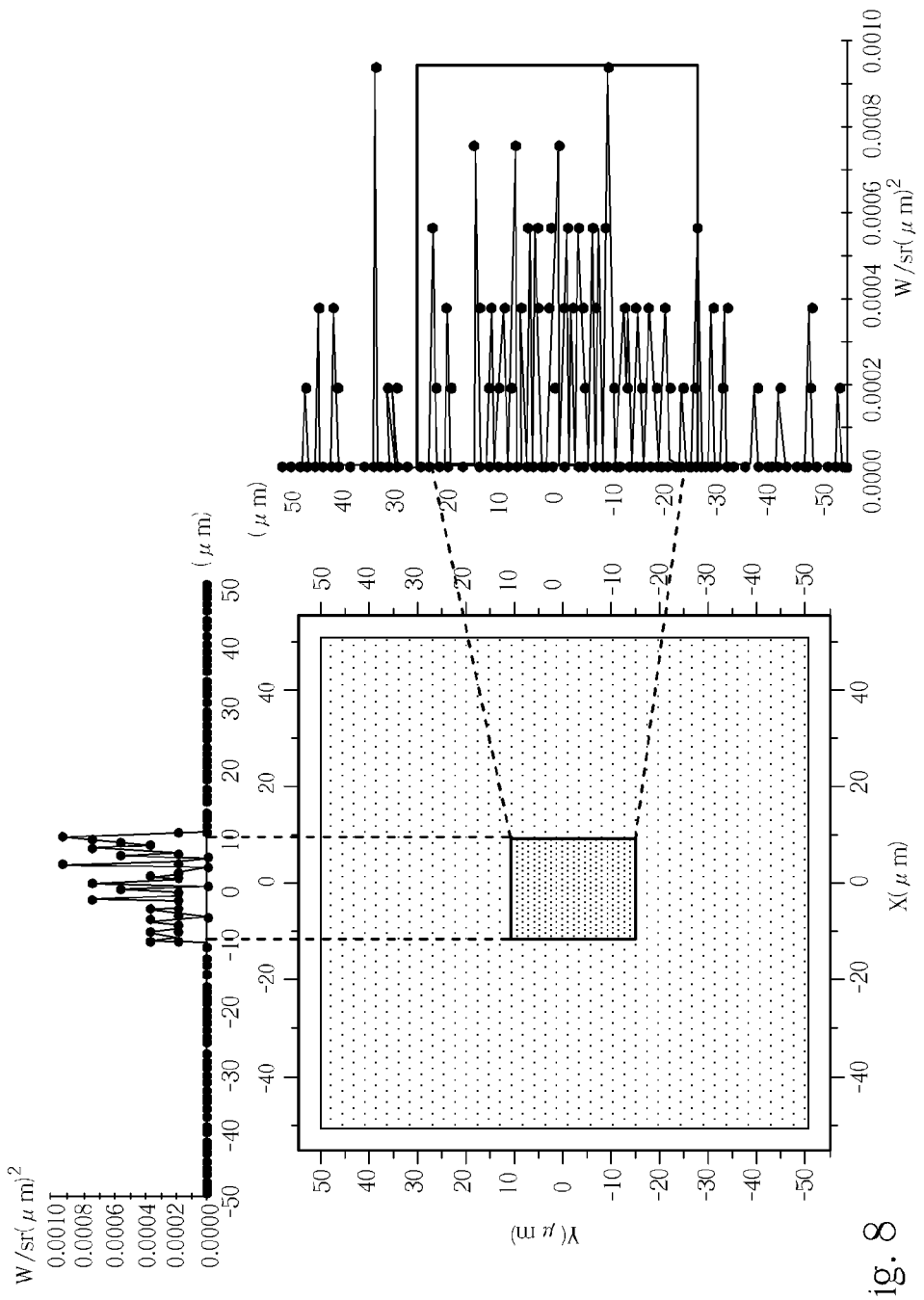
FIG. 8 is a schematic diagram illustrating brightness distribution of the sub-pixel according to another embodiment.

Please refer to FIG. 8. FIG. 8 is a schematic diagram illustrating brightness distribution of the sub-pixel according to the above embodiment. In this embodiment, the sub-pixel is a rectangular area of 100 micron multiplied by 100 micron. The micro lenses are semicylinder-like structures arranged in a square array formation. The diameter of the semicylinder-like structure is 20 micron, the height thereof is 10 micron, and the length thereof is 50 micron. The distance between two adjacent semicylinder-like structures is 5 micron.

As shown in FIG. 8, the major axis directions of the semicylinder-like structures are arranged along the X direction, and the semicylinder-like structures in the Y direction have a light-condensing effect. Therefore, the brightness distribution of the sub-pixels in the Y direction is affected by the light-condensing effect of the semicylinder-like structures to have a situation of centralized distribution. Because the sub-pixels of the same pixel are arranged along the Y direction, the brightness distribution in the Y direction of the sub-pixels in the embodiment having a situation of obvious centralized distribution will produce the problem of the sub-pixels in the same pixel disturbing each other. But because the three sub-pixels RGB still belong to the same pixel, human eyes cannot differentiate the problem of the sub-pixels in the same pixel disturbing each other so that the image distortion will not be perceived. On the other hand, the sub-pixels of the same color in the X direction belong to different pixels. Because the semicylinder-like structure in the X direction has no light-condensing effect, the sub-pixels of the same color belonging to different pixels do not have disturbance between them. Therefore, the embodiment can further reduce the problem of image blur.

Figure 9:
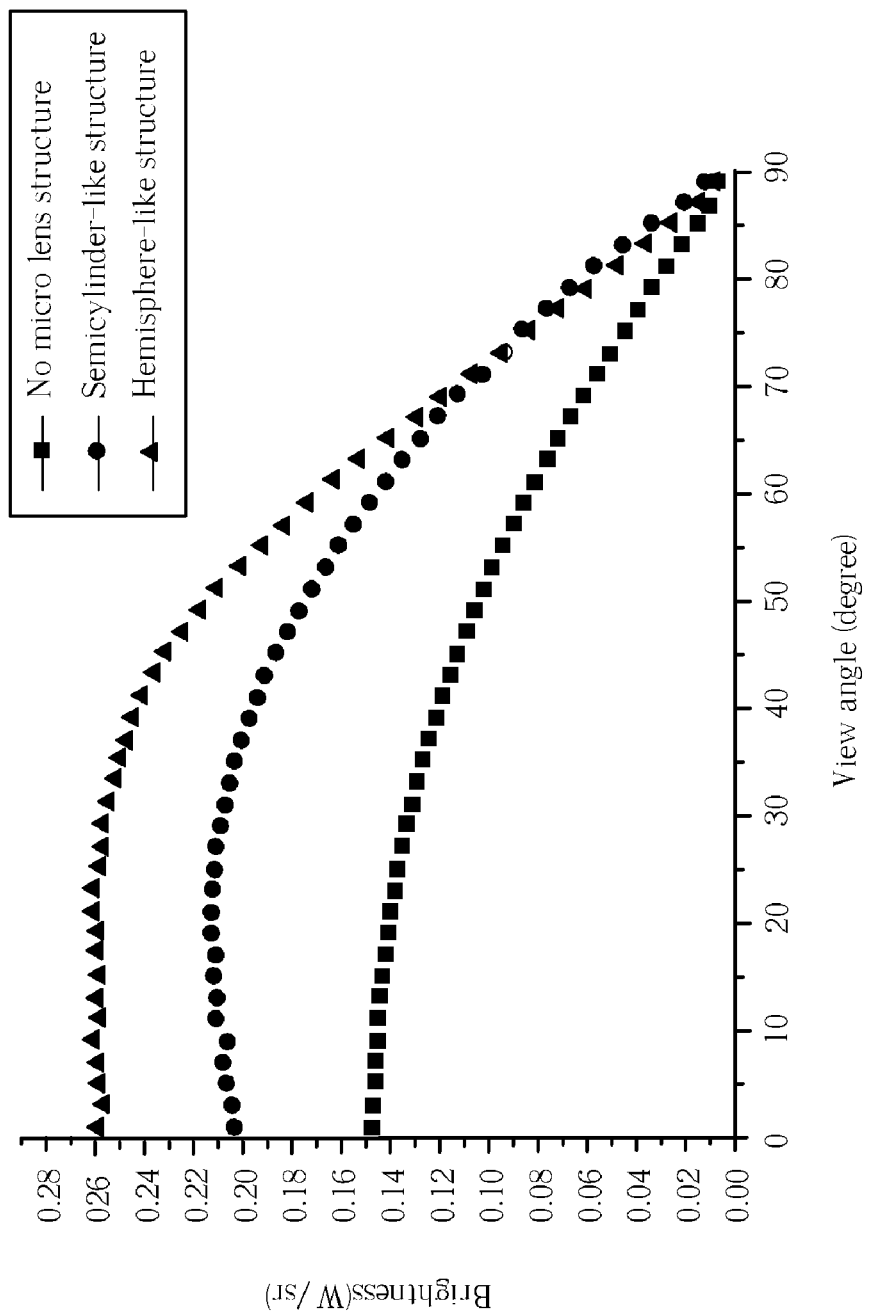
FIG. 9 is a relationship diagram between the brightness and the view angle of the electroluminescent panel of the present invention.

Please refer to FIG. 9. FIG. 9 is a relationship diagram between the brightness and the view angle of the electroluminescent panel of the present invention. As shown in FIG. 9, comparing the electroluminescent panel without a brightness enhanced film, the brightness of the electroluminescent panel including the brightness enhanced film has an obvious increase. As mentioned above, the brightness enhanced film of the present invention can increase the display brightness of the electroluminescent panel, and does not produce the problem of image blur to affect displaying quality.

Figure 10:
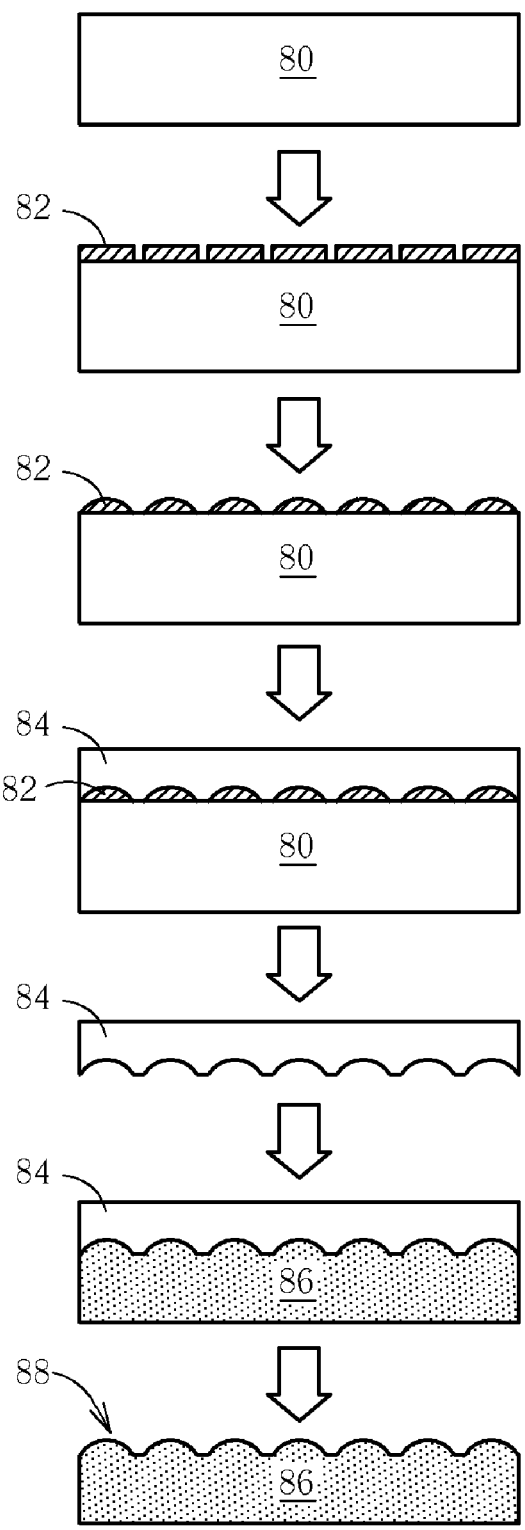
FIG. 10 is a schematic diagram demonstrating a method for manufacturing a brightness enhanced film according to a preferred embodiment of the present invention.

Please refer to FIG. 10. FIG. 10 is a schematic diagram illustrating a method for manufacturing a brightness enhanced film according to a preferred embodiment of the present invention. As shown in FIG. 10, first, a substrate 80 is provided, and then, a photosensitive material layer, such as a photo-resist layer, is formed on the surface of the substrate 80. Next, the photosensitive material layer is defined as a plurality of photosensitive patterns 82 by utilizing a lithography process, wherein the shape of the photosensitive pattern 82 is decided according to the shape of the micro lens needed in the follow-up.

For example, if the micro lens is a hemisphere-like structure, the photosensitive pattern 82 should be close to being cylindrical. If the micro lens is a semicylinder-like structure, the photosensitive pattern 82 should be close being a rectangle. In addition, the layout of the photosensitive patterns 82 are also decided according to the layout of the micro lenses needed in the follow-up, and the photosensitive patterns 82 is arranged in a square array. Then, a thermal reflow process is performed, and the shape of each photosensitive pattern 82 is formed as the hemisphere or semicylinder structure by controlling the parameters, such as temperature, pressure, heating time, etc.

Subsequently, a stamper 84 is formed on the surface of the substrate 80 and the photosensitive pattern 82 so that the stamper 84 has the pattern complementary to the photosensitive pattern 82. A thermal process is performed to let the stamper 84 have enough structure strength. Then, a releasing process is performed to let the stamper 84 release from the surface of the substrate 80. Finally, a brightness enhanced film 86 having micro lenses 88 can be done by the stamper 84 and utilizing the technique of micro-injection molding or micro hot embossing etc., and then, the brightness enhanced film 86 is stuck on the illumination surface of the electroluminescent panel. Therefore, the electroluminescent display is accomplished. It is appreciated that because the photosensitive pattern needs to pass the thermal reflow process, the structure of the photosensitive pattern may be a little distorted so as not to form a perfect hemisphere or semicylinder structure. But to form the micro lens having hemisphere-like or semicylinder-like structure still can perform the effect of reducing image blur and increasing brightness.

To sum up, due to the disposition of the brightness enhanced film, the electroluminescent display of the present invention not only has the effect of increasing brightness gain but also will not result in the problem of output image blur, so the display quality can be effectively improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electroluminescent display, comprising:
an electroluminescent panel having a plurality of sub-pixels and at least one illumination surface, wherein the plurality of sub-pixels comprise a plurality of red sub-pixels, green sub-pixels and blue sub-pixels, and the sub-pixels having the same color are arranged in the same direction; and
at least one brightness enhanced film having a plurality of micro lenses, disposed on the at least one illumination surface, wherein each of the plurality of micro lenses has a width smaller than half of the minimum width of each of the plurality of sub-pixels, the micro lens has a major axis direction and a minor axis direction substantially intersected to the major axis direction, a projection shape of each of the plurality of micro lenses projected on the illumination surface has two straight sides opposite to each other, a cross-sectional shape of each of the plurality of the micro lens along the minor axis direction is a semicircular shape, and the major axis direction is substantially parallel to the arranged direction of the sub-pixels having the same color, wherein a distance exists between two adjacent micro lenses.

2. The electroluminescent display of claim 1, wherein a width of each of the micro lens is a diameter of the semicircular shape.

3. The electroluminescent display of claim 1, wherein each of the micro lenses has a length substantially parallel to the major axis direction, and the length of the micro lens is smaller than the width of each sub-pixel.

4. The electroluminescent display of claim 1, wherein the distance exists between two adjacent, micro lenses is substantially 5 microns.

5. The electroluminescent display of claim 1, wherein the plurality of micro lenses are arranged in a rectangular array.

6. The electroluminescent display of claim 1, wherein the plurality of micro lenses are arranged in a square array.

7. The electroluminescent display of claim 1, wherein each of the plurality of sub-pixels is a rectangular area, and the minimum width of the plurality of sub-pixels is the width of the rectangular area.

8. The electroluminescent display of claim 1, wherein the electroluminescent panel comprises an organic light emitting diode panel or a polymer light emitting diode panel.

9. The electroluminescent display of claim 1, wherein the brightness enhanced film is adhered to the surface of the at least one illumination surface of the electroluminescent panel.

10. The electroluminescent display of claim 1, wherein the projection shape of each of the plurality of micro lenses projected on the illumination surface is a quadrangle.

11. The electroluminescent display of claim 10, wherein the two straight sides of the quadrangle are substantially parallel to the major axis direction.

12. The electroluminescent display of claim 1, wherein the projection shape of each of the plurality of micro lens projected on the illumination surface further has two curved sides opposite to each other and connected to the two straight sides.

13. The electroluminescent display of claim 1, wherein the major axis direction substantially parallel to the arranged direction of the sub-pixels having the same color is capable of reducing blur effects.

* * * * *